(12) United States Patent
Hsieh (10) Patent No.: US 6,831,326 B1
(45) Date of Patent: Dec. 14, 2004

(54) TRAPEZOID FLOATING GATE TO IMPROVE PROGRAM AND ERASE SPEED FOR SPLIT GATE FLASH

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/661,745

(22) Filed: Sep. 12, 2003

(51) Int. Cl.[7] .................... H01L 29/788; H01L 21/336
(52) U.S. Cl. ........................................ 257/315; 438/257
(58) Field of Search .................. 257/314–326; 438/257–267, 283

(56) References Cited

U.S. PATENT DOCUMENTS

| | | | |
|---|---|---|---|
| 5,393,682 A | 2/1995 | Liu | |
| 5,723,371 A | 3/1998 | Seo et al. | 438/158 |
| 5,728,259 A | 3/1998 | Suzawa et al. | 156/646.1 |
| 6,228,695 B1 | 5/2001 | Hsieh et al. | 438/201 |
| 6,259,131 B1 | 7/2001 | Sung et al. | 257/315 |

Primary Examiner—Evan Pert (57) ABSTRACT

A structure is disclosed for split-gate flash memory cells in which isolation regions separate parallel active regions within a semiconductor region. Trapezoidal floating gates, separated from the active regions by an insulator layer, are equally spaced over the active regions. Three tiered parallel strips run perpendicular to the active regions and pass over corresponding trapezoidal floating gates, the bottom and top tiers being insulator layers and the middle tier being a conductor layer. Insulator spacers are disposed over the sidewalls of the three-tiered parallel strips and of the trapezoidal floating gates. These parallel structures are designated floating gate towers. Source/drain regions are formed in the semiconductor region of every other opening between floating gate towers where they are contacted by source/drain contact lines. An insulator layer is disposed over the source/drain contact lines. The other openings between floating gate towers contain select gates, which are conductive columns that are separated from the semiconductor region by an insulator layer and rise over active regions. Parallel select gate contact lines are disposed over and run along the active regions contacting the select gates.

28 Claims, 11 Drawing Sheets

TRAPEZOID FLOATING GATE TO IMPROVE PROGRAM AND ERASE SPEED FOR SPLIT GATE FLASH

BACKGROUND OF THE INVENTION (1) Field of the Invention

The present invention relates generally to semiconductor integrated circuit technology and more particularly to memory cells used in flash EEPROMs (Electrically Erasable Programmable Read Only Memory).

(2) Description of Prior Art

The efficiency of program operation in split-gate flash memory cells is, to a large extent, dependent on the speed of the programming and erasing operations. In traditional split-gate flash memory cells in which programming is accomplished by source side injection it is preferable to have very thin oxide spacers separating floating gates and control gates from select gates and bit lines. Thinner oxide spacers allow for greater programming speed. However, thinner oxide spacers could result in increased leakage current and lower yield and reliability. Floating gates of traditional split-gate flash memory cells have square cross-sections. The erasing operation is often accomplished by channel erasing, that is, by injection of charge from the floating gate to the underlying channel. A square floating gate cross-section does not provide very much of an increased electric field at the corners, which limits the speed of channel erasing attainable with traditional split-gate flash memory cells.

Figure 1:
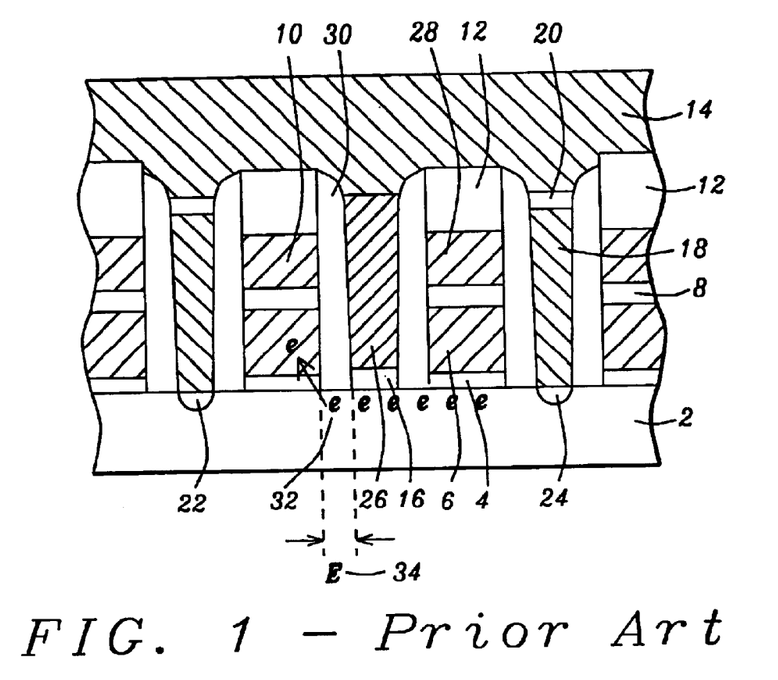
FIG. 1 shows source side programming in a traditional split-gate flash memory cell.
Figure 2:
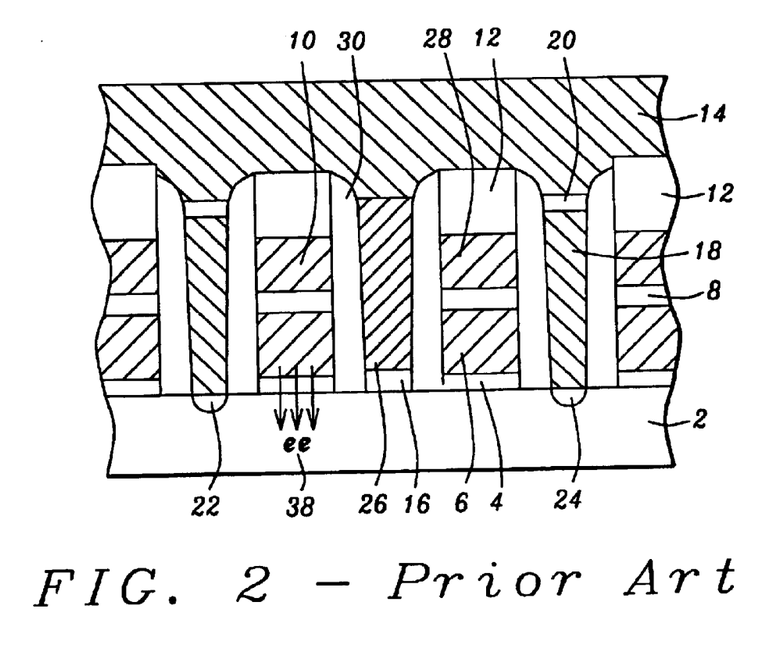
FIG. 2 shows channel erasing in a traditional split-gate flash memory cell.

Source side programming in a traditional split-gate flash memory cell is shown in FIG. 1 and channel erasing in a traditional split-gate flash memory cell is shown in FIG.2. The traditional split-gate flash memory cell shown in FIGS. 1 and 2 is contained between conductive bit lines, 18, which connect to source regions, 24, and drain regions, 22, that are formed in a semiconductor region, 2. Bit line insulator regions, 20, insulate the bit lines, 18, from select gate lines, 14, which connect to select gates, 26 that are separated from the semiconductor region, 2, by a select gate insulator layer, 16. Charging towers, situated between bit lines connecting to drain regions and select gates, are comprised of a floating gate insulator layer, 4, separating floating gates, 6, from the semiconductor region, 2; control gates, 10, separated from the floating gates by an intergate gate insulator region, 8; top insulator regions, 12, isolating the control gates from the select gate lines, 14 and sidewall insulator spacers, 30 that insulate the floating gates and control gates from the bit lines, 18 and select gates, 26. Transfer gate towers, situated between bit lines connecting to source regions and select gates, are comprised of a floating gate insulator layer, 4, separating floating gates, 6, from the semiconductor region, 2; transfer gates, 28, separated from the floating gates by an intergate gate insulator region, 8; top insulator regions, 12, isolating the transfer gates from the select gate lines, 14 and sidewall insulator spacers, 30 that insulate the floating gates and floating gates from the bit lines, 18 and select gates, 26.

Referring to FIG. 1, there is depicted source side programming in a traditional split-gate flash memory cell. Channel electrons, 32, are accelerated by the lateral field E, 34, acting over the distance x, 36, which in traditional split-gate flash memory cells is also the thickness of the insulator spacer between the control gate and select gate and also the floating gate and select gate. The larger the field E the easier it is for electrons to attain sufficient energy so that they can readily overcome the barrier presented by the floating gate insulator layer and pass into the floating gate. Thus with larger fields, E, attained by an increased potential difference between the control gate and select gate, there is more efficient charge injection into the floating gate and greater programming speed. However, with the sidewall insulator spacer thickness being the same as the separation x, the field across the spacer is as large or larger than E, especially during channel erasing when the potential difference across the spacer is even larger than during programming. Low leakage requirements and other yield and reliability considerations place restrictions on the magnitude of the field across the sidewall insulator spacer and thus on the field E, thereby limiting the attainable programming speed.

Referring now to FIG. 2, there is depicted channel erasing in a traditional split-gate flash memory cell. In channel erasing an applied potential difference between the control gate, 10 and the semiconductor region, 2, sets up a field at the floating gate-floating gate insulator layer, 4, interface. Due to the action of this field electrons, 38, pass from the floating gate through the floating gate insulator layer and into the semiconductor region. The rate at which electrons are ejected from the floating gate, and therefore the erasing rate, is exponentially dependent on the interface field. In the vicinity of sharp corners of the floating gate at the interface there is an intensification of the interface field and a resulting even greater intensification of the erasing rate. In traditional split-gate flash memory cells using channel erasing the floating gate cross-section is square with corners, 40, which are not sharp enough for a significant intensification of the erasing rate.

U.S. Pat. No. 5,393,682 to Liu shows a method for making tapered polysilicon gates, the purpose being to reduce the sharpness of corners, thus improving step coverage and the quality of deposited layers around polysilicon edges. U.S. Pat. No. 5,723,371 to Seo et al. teaches a method for fabricating a thin film transistor having a taper-etched semiconductor film, where the sharpness of corners is reduced. Another process for tapered silicon films is shown in U.S. Pat. No. 5,728,259 to Suzawa et al. in a method of fabricating a semiconductor device in which a gate insulating layer has no plasma induced damage. In U.S. Pat. No. 6,228,695 B1 to Hsieh et al., a split-gate flash memory cell is shown with self-aligned source and self-aligned floating gate to control gate. The method replaces the conventional polysilicon oxidation process thereby yielding a sharper floating gate edge for improved programming and erasing. U.S. Pat. No. 6,259,131 B1 to Sung et al. shows a method of forming a polysilicon gale tip in split-gate flash memory cells for enhanced F-N tunneling.

SUMMARY OF THE INVENTION

It is a primary objective of the invention to provide a split-gate flash memory cell structure with increased programming and erasing speed with no increase in leakage current and no reduction in yield and reliability. It is another primary objective of the invention to provide a method of achieving a split-gate flash memory cell structure with increased programming and erasing speed with no increase in leakage current and no reduction in yield and reliability.

These objectives are achieved in split-gate flash memory cell structures according to the embodiments of the invention in which the floating gate has a trapezoidal cross-section. The structures of preferred embodiments of the invention allow for large electric fields to efficiently energize channel electrons in source side programming, while the sidewall insulator spacer thickness can be maintained large enough to preclude any leakage current, yield and reliability exposures. A trapezoidal cross-section allows for sharp corners facing the semiconductor region across the floating gate insulator layer. This leads to enhanced channel erasing speed.

A structure is disclosed for split-gate flash memory cells in which isolation regions separate parallel active regions within a semiconductor region. Trapezoidal floating gates, separated from the active regions by an insulator layer, are equally spaced over the active regions. Three tiered parallel strips run perpendicular to the active regions and pass over corresponding trapezoidal floating gates, the bottom and top tiers being insulator layers and the middle tier being a conductor layer. Insulator spacers are disposed over the sidewalls of the three-tiered parallel strips and of the trapezoidal floating gates. These parallel structures are designated floating gate towers. Source/drain regions are formed in the semiconductor region of every other opening between floating gate towers where they are contacted by source/drain contact lines. An insulator layer is disposed over the source/drain contact lines. The other openings between floating gate towers contain select gates, which are conductive columns that are separated from the semiconductor region by an insulator layer and rise over active regions. Parallel select gate contact lines are disposed over and run along the active regions contacting the select gates.

BRIEF DESCRIPTION OF THE DRAWINGS

In the accompanying drawing forming a material part of this description, there is shown:

FIGS. 3a–13a show top views at various stages of forming a split-gate flash memory cell with a trapezoidal floating gate, for increased programming and erasing speed, according to the invention.

FIGS. 3b–13b and 13c show cross-sectional views at various stages of forming a split-gate flash memory cell with a trapezoidal floating gate, for increased programming and erasing speed, according to the invention

DESCRIPTION OF THE PREFERRED EMBODIMENTS

Figure 3A:
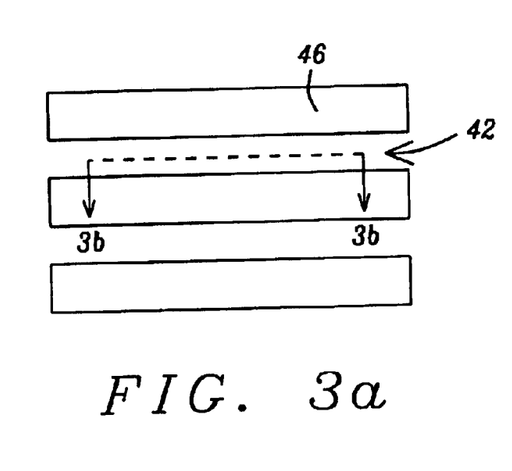
Figure 3B:
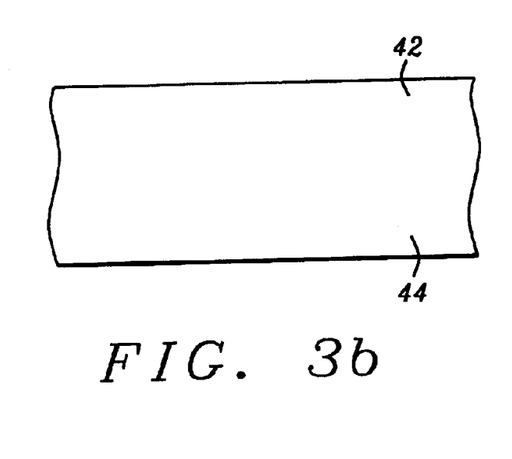
Figure 4A:
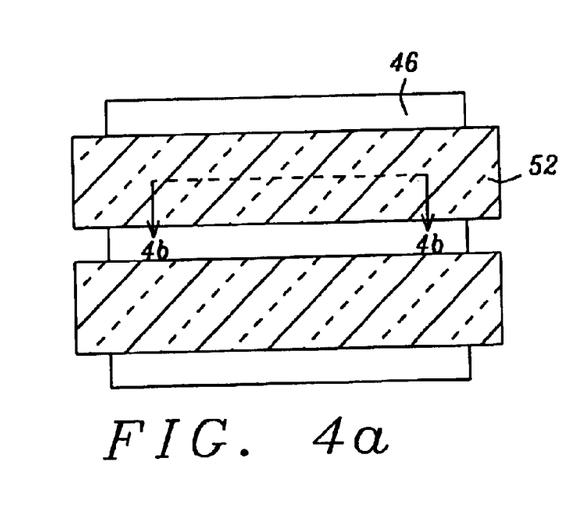
Figure 4B:
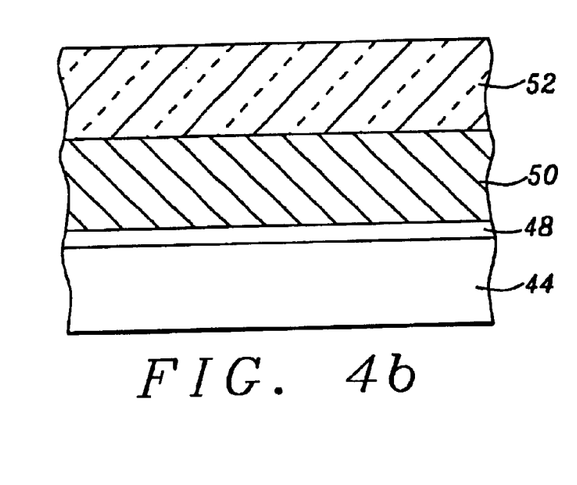
Figures 5A, 6A:
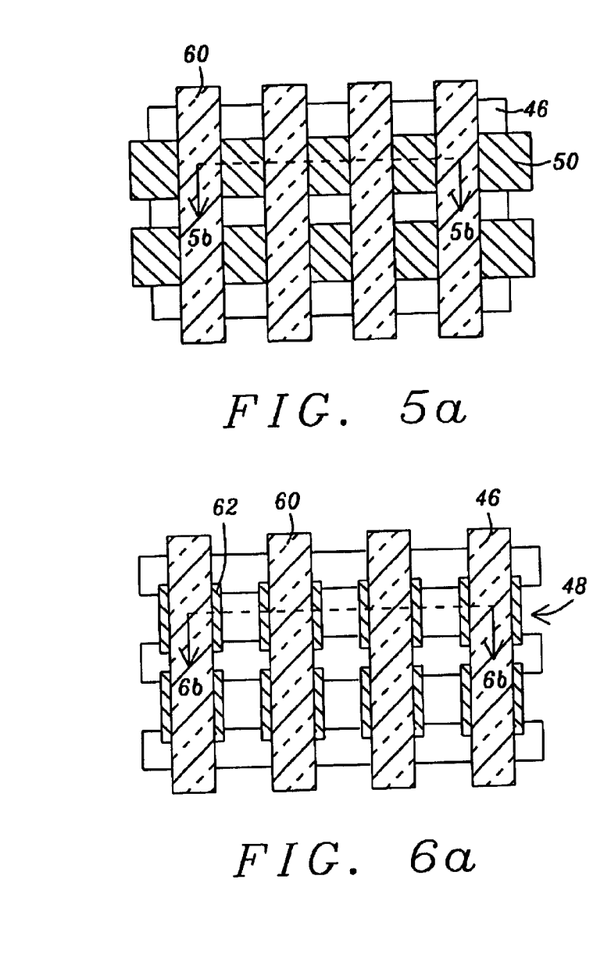
Figure 5B:
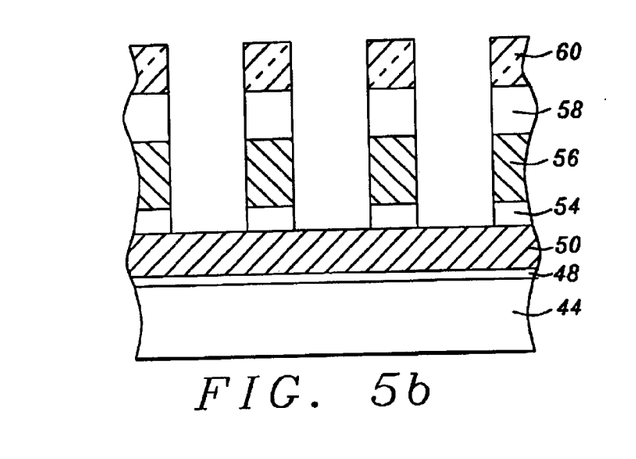

Preferred embodiments of the invention are well described with the aid of FIGS. 3a–13i and 3b–13b and 13c. A method of fabricating a split-gate memory cell with a trapezoidal floating gate is presented in FIGS. 3a–13a, where top views are presented at successive stages of the process and in FIGS. 3b–13b and 13c, which show the corresponding cross-sectional views. As shown in FIGS. 3a and 3b, active regions, 42, are defined on a semiconductor region, 44, which preferably is a p-type silicon region, using isolation regions, 46, such as shallow trench isolation, STI, regions. A floating gate dielectric layer, 48, is then formed over the active regions to a thickness of about 100 Angstroms. Preferably the floating gate dielectric layer is a thermally grown oxide. The gate dielectric layer serves as the dielectric layer between the semiconductor region and the floating gate. Deposition of a blanket first conductive layer, 50, follows, from which floating gates are to be fashioned and which preferably is a first polysilicon layer deposited to a depth of about 800 Angstroms. The fist conductive layer is patterned to form strips covering the active regions, 42. Forming a photoresist layer, 52, patterning the photoresist layer, as shown in FIG. 4a, etching the first conductive layer and removing the photoresist layer can for example, accomplish this patterning. Three layers are then successively formed; a second insulator layer, 54, a second conductive layer, 56, and a third insulator layer, 58. The second insulator layer, whose role is to insulate floating gates from control and transfer gates, is preferably an ONO layer, with the thickness of its component layers, the bottom oxide, nitride and top oxide layers, each being about 60 Angstroms. Preferably, the second conductive layer, from which control and transfer gates are to be constructed, is a polysilicon layer about 1000 Angstroms thick The third insulator layer is preferably a nitride layer of about 1500 Angstroms thick. These three layers are patterned into equidistant parallel strips perpendicular to the active regions. Forming a photoresist layer, 60, patterning the photoresist layer, as shown in FIGS. 5a and 5b, successively etching the third insulator layer, the second conductive layer and the second insulator layer can, for example, accomplish this patterning, Since the masking provided by the patterned photoresist layer can still be utilized for the next process step, it is not removed until after the next process step.

Figure 6B:
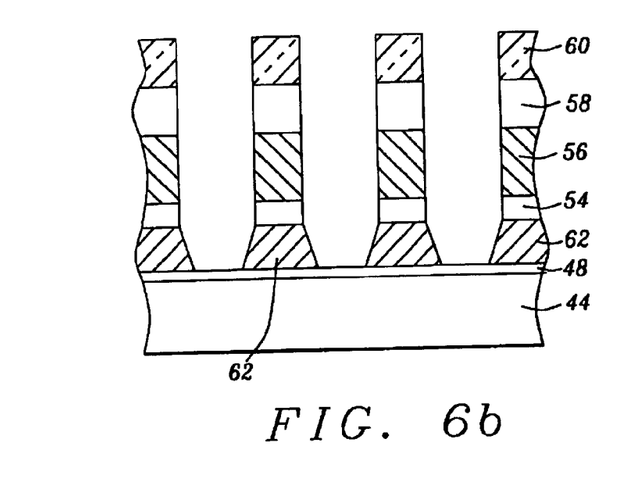
Figure 7A:
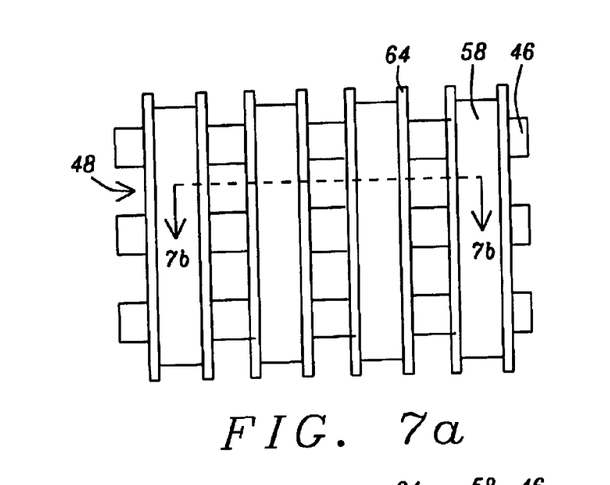
Figure 7B:
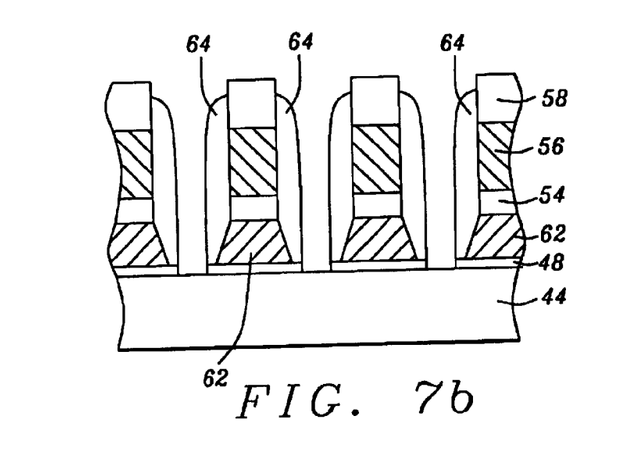
Figure 8A:
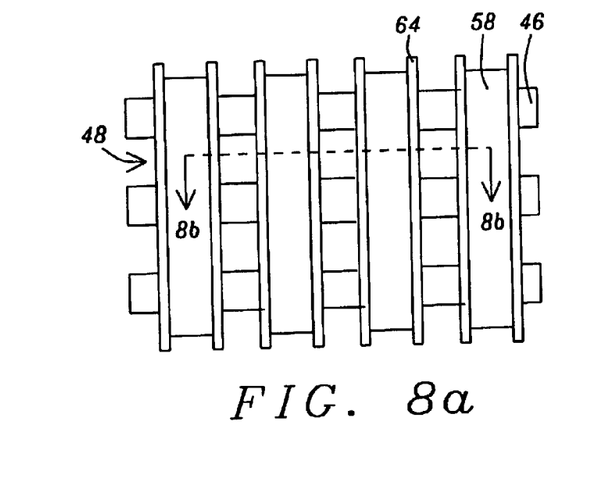
Figure 8B:
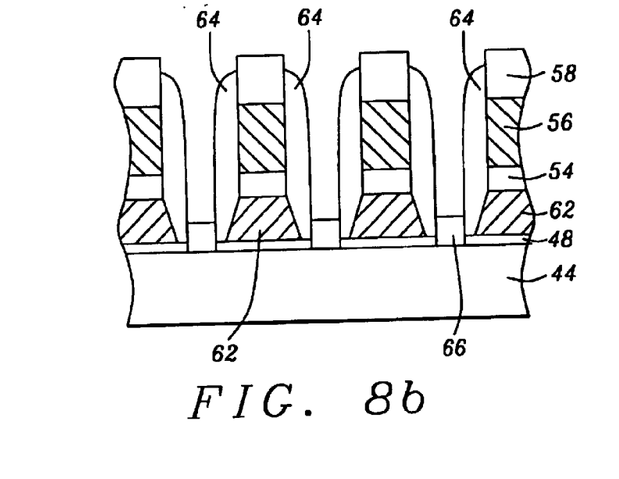
Figure 9A:
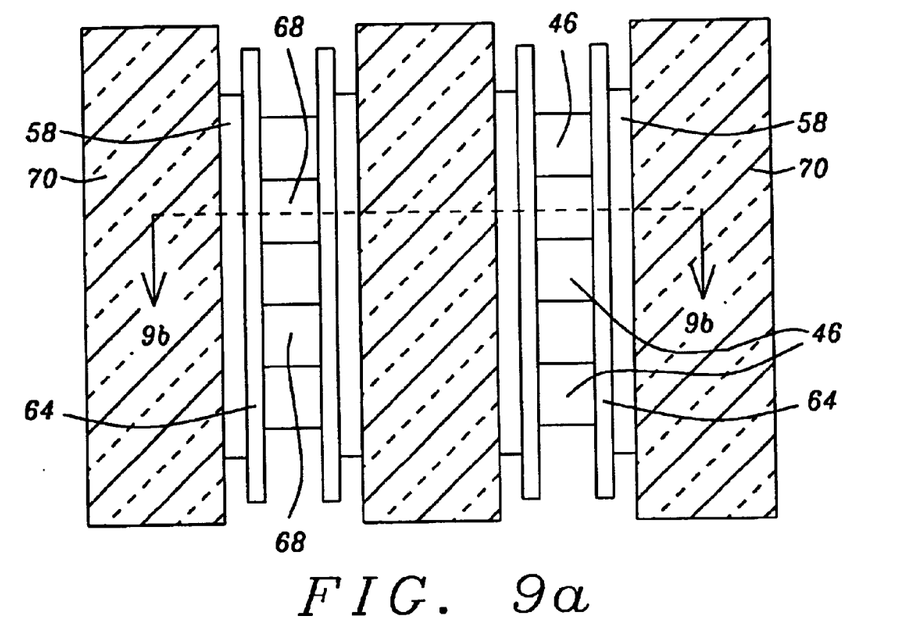
Figure 9B:
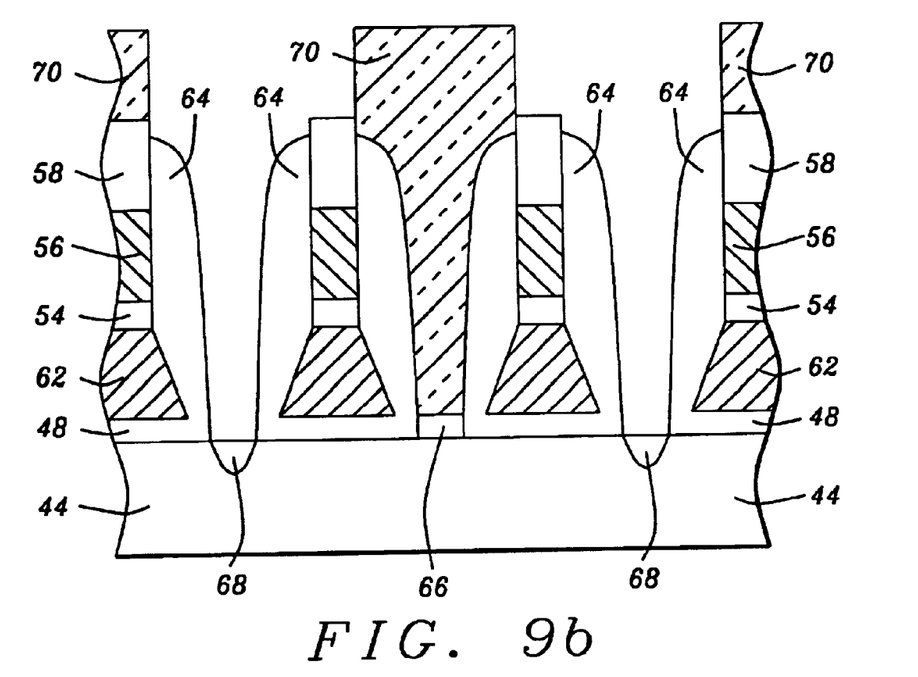
Figure 10A:
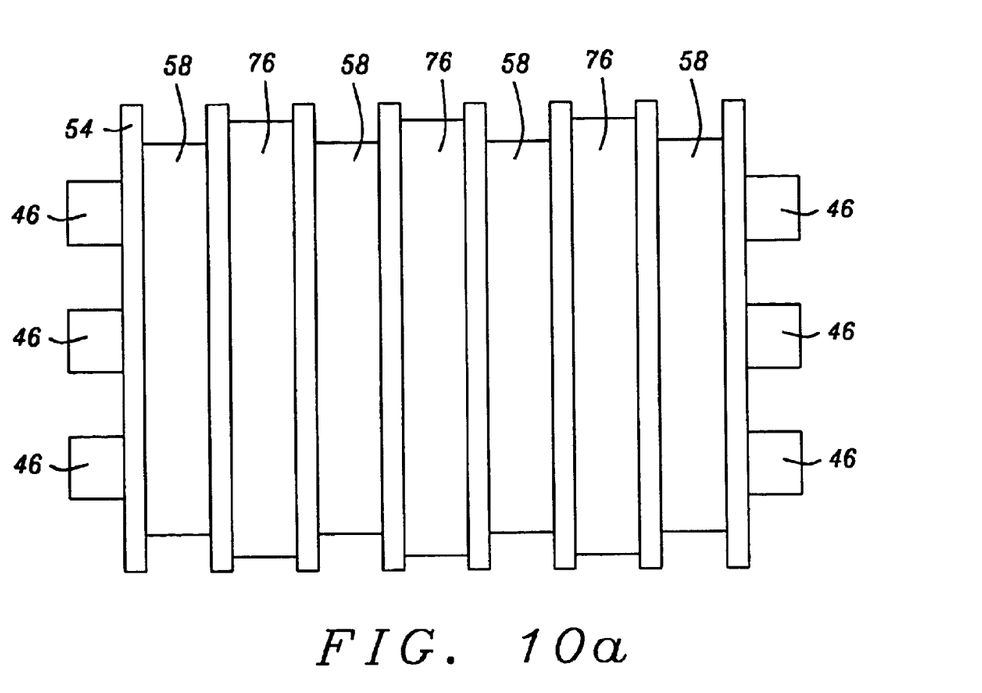
Figure 10B:
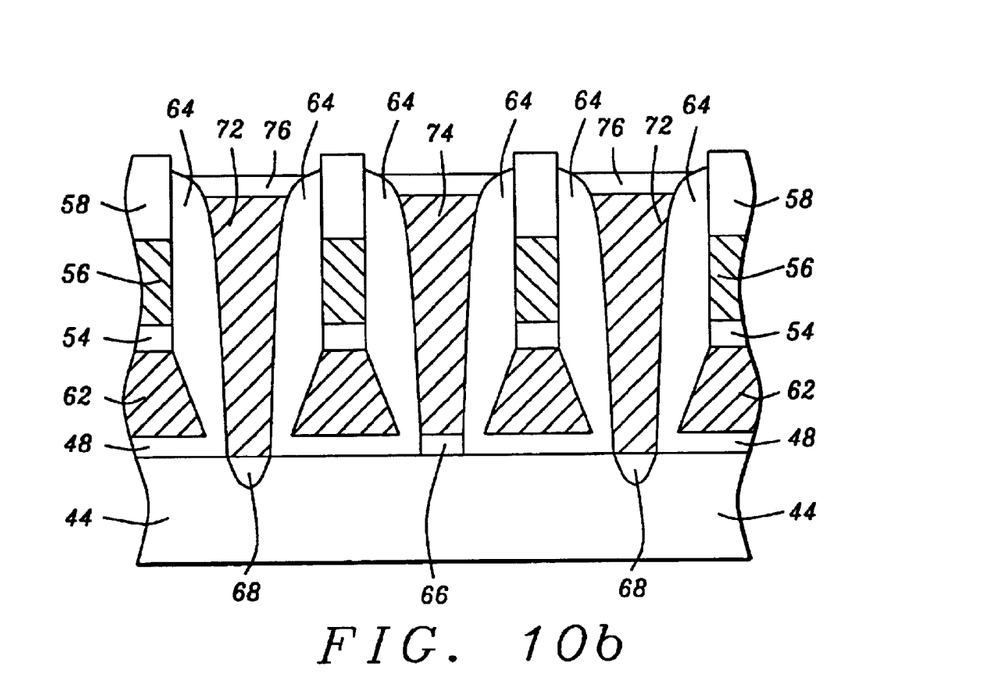
Figure 11A:
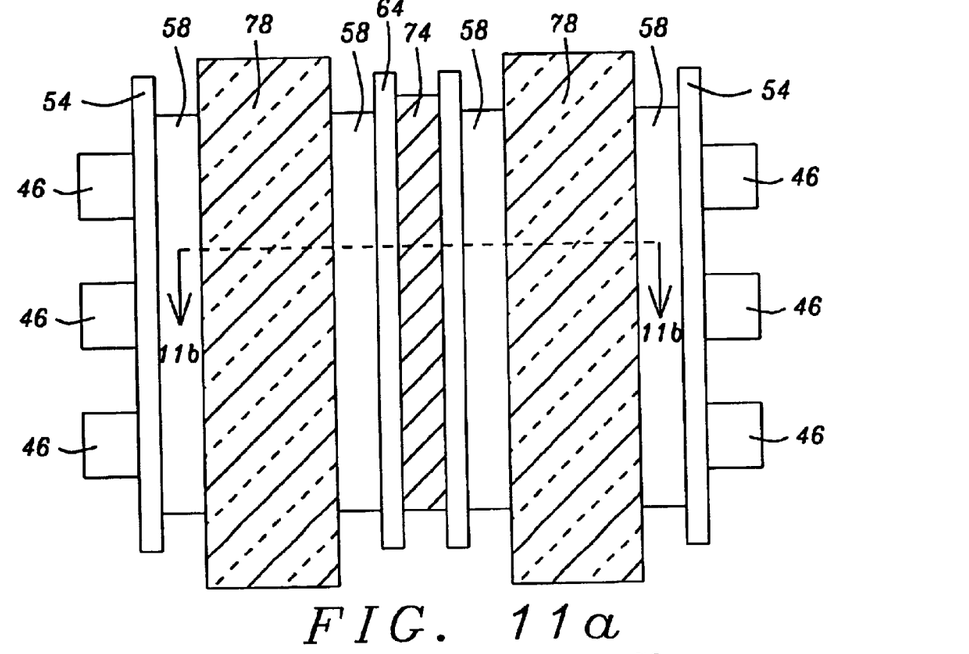
Figure 11B:
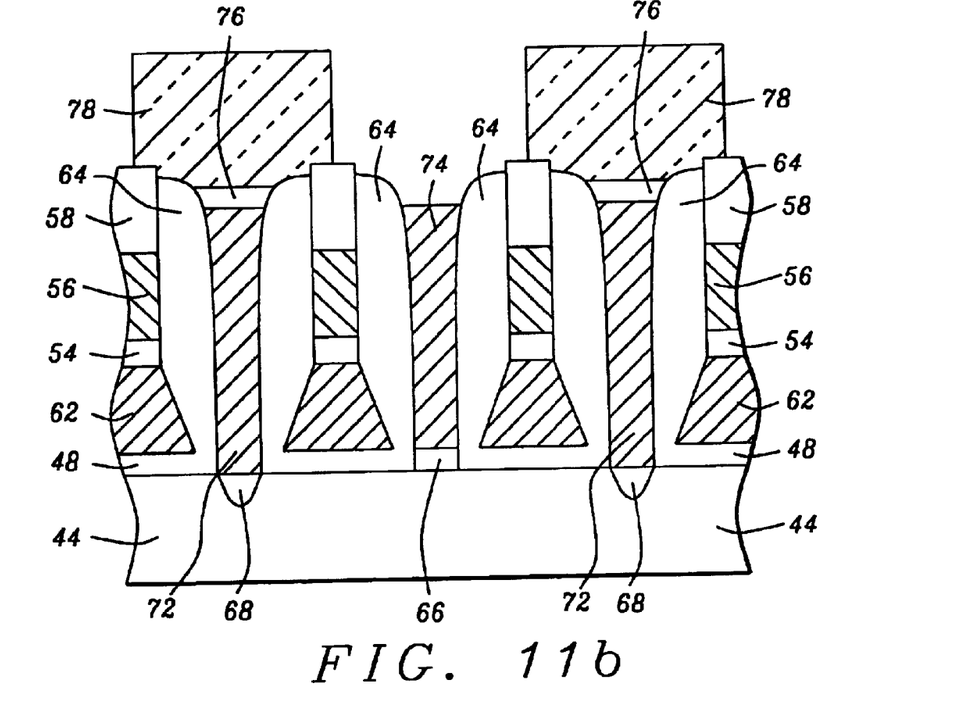
Figure 12A:
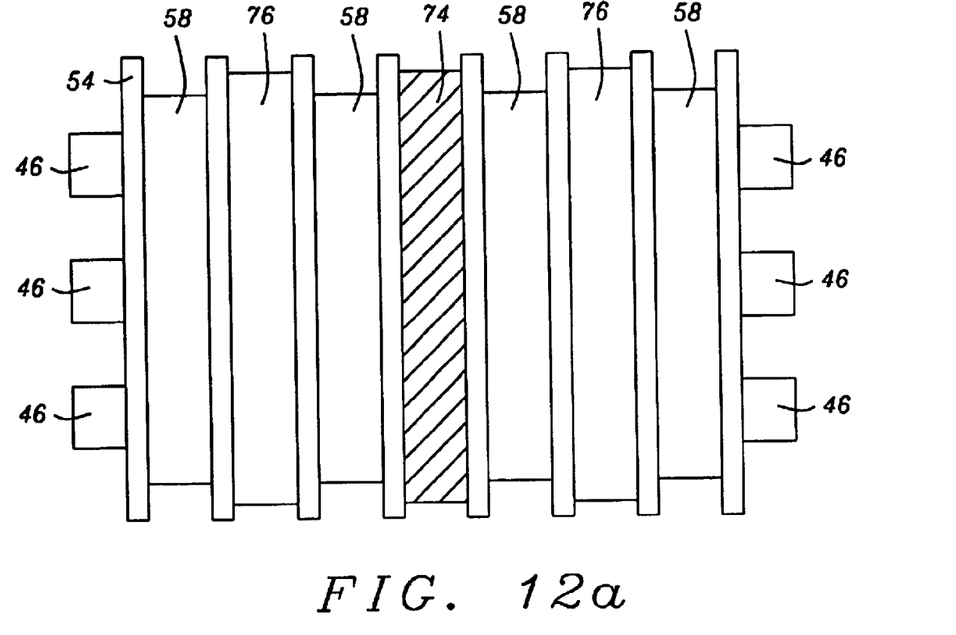
Figure 12B:
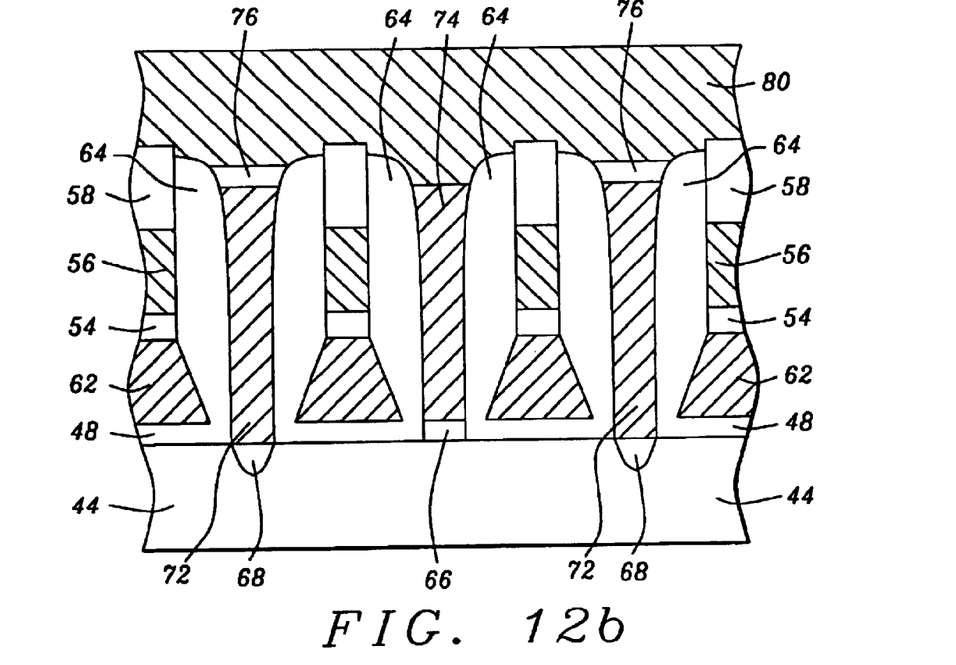
Figure 13A:
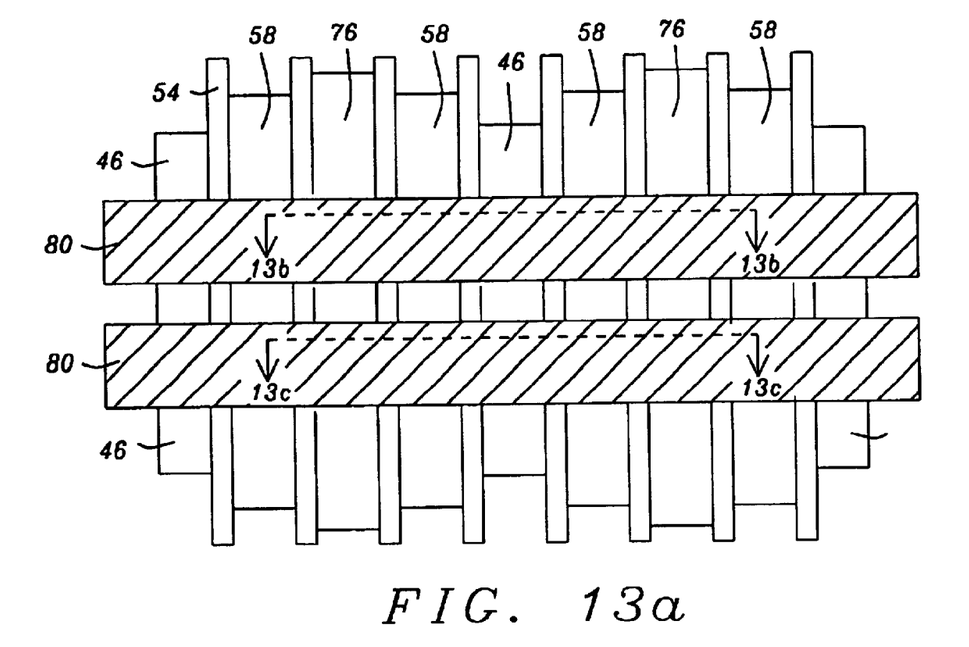
Figure 13B:
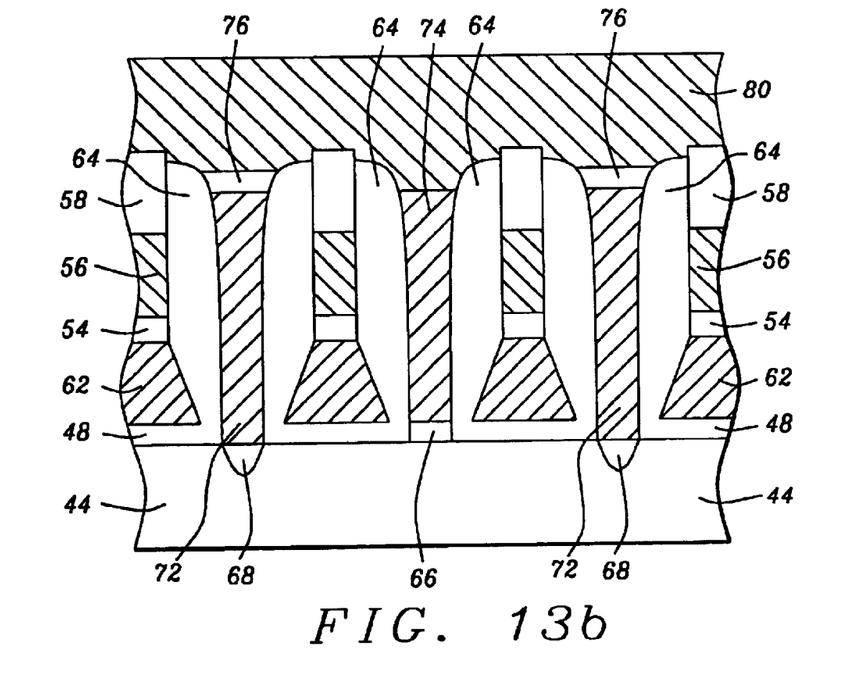
Figure 13C:
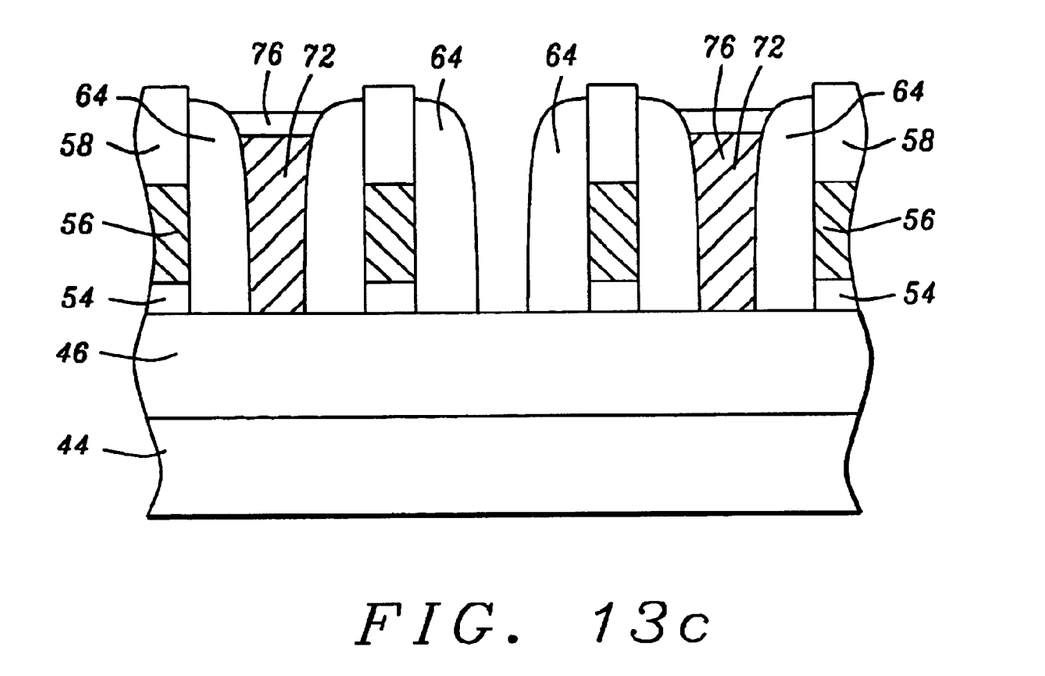

In the next process step the trapezoidal cross-section of the floating gates, 62, a shape that is crucial to the invention, is established. This accomplished by utilizing an etching procedure in etching the first conductive layer that results in sloping sidewalls that give rise to a trapezoidal cross-section, such as is shown for the floating gate cross-section, 62, in FIG. 6b. This procedure, to be designated the sloping sidewall etching procedure, is described in detail in U.S. Pat. No. 6,090,668 to Lin, which is hereby incorporated by reference. At this stage the structure is shown in FIGS. 6a and 6b. The photoresist layer, or other masking, is removed and a conformal fourth insulator layer is deposited and etched to form insulator spacers, 64. Preferably the fourth insulator layer is an HTO (high temperature oxide) layer about 600 Angstroms thick. A threshold voltage adjust implant can now be performed, which could be a boron implant through the openings between adjacent insulator spacers, at energy about 20 keV and to a dose of about 5E15 $cm^{-2}$. A fifth insulator layer, 66, is formed over the exposed semiconductor region, as shown in FIGS. 8a and 8b. The fifth insulator layer is preferably a grown oxide layer about 150 Angstroms in thickness. Source/drain regions, 68, are now to be formed in the semiconductor region. To this end the fifth insulator layer is removed from every other opening between insulator spacers and a source/drain ion implantation performed through those openings. A preferred procedure to accomplish this is shown in FIGS. 9a and 9b. A photoresist layer is formed and patterned, 70, to expose every other opening. The exposed fifth insulator layer of the exposed openings is etched. A source/drain ion implantation is performed, which preferably is an arsenic ion implantation at energy about 50 keV and to a dose of about 2E15 $cm^{-2}$, and then the photoresist layer is removed. After a third conductor layer, which preferably is a polysilicon layer to a depth of about 3000 Angstrom, is deposited, it is etched back to form conductive plugs, 72, and 74, as indicated in FIGS. 10a and 10b. Plugs 72 are the source/drain contact lines and plugs 74 are select gates. Next a sixth insulator layer, 76, is formed over the conductive plug which preferably is an oxide layer grown over the plugs to a thickness of about 300 Angstroms. However the sixth insulator layer is only required to insulate the source/drain contact lines, 72, and needs to be removed from over the select gates, 74. Forming a photoresist layer and patterning it to expose only the sixth insulator layer over the select gates, such as regions 78 in FIGS. 11a and 11b, etching the exposed sixth insulator layer and removing the photoresist layer is a method to accomplish the removal of the sixth insulator layer from over the select gates. Select gate contact lines, 80, can now be formed. These are formed from a fourth conductive layer as parallel strips disposed over the active regions. The select gate contact lines are in electrical contact with the select gates. Portions of select gates disposed over isolation regions are removed. Stages in the process steps to accomplish completion of the select gates and formation of the select gate contact lines are shown in FIGS. 12a, 12b, 13a, 13b and 13c. The top view of FIG. 12a shows the structure below the overlying fourth conductor layer. Forming a fourth conductor layer, which preferably is a polysilicon layer about 1500 Angstroms thick, the fourth conductive layer is patterned into parallel strips, 80, disposed over the active regions, which are the select gate contact lines. Forming a photoresist layer over the fourth conductor layer and patterning it into parallel strips disposed over the active regions, etching the exposed fourth and third conductor layers and removing the photoresist layer is a method to accomplish the patterning. This completes the cell according to preferred embodiments of the invention, whose structure is shown in FIGS. 13a , 13b and 13c.

Figure 14:
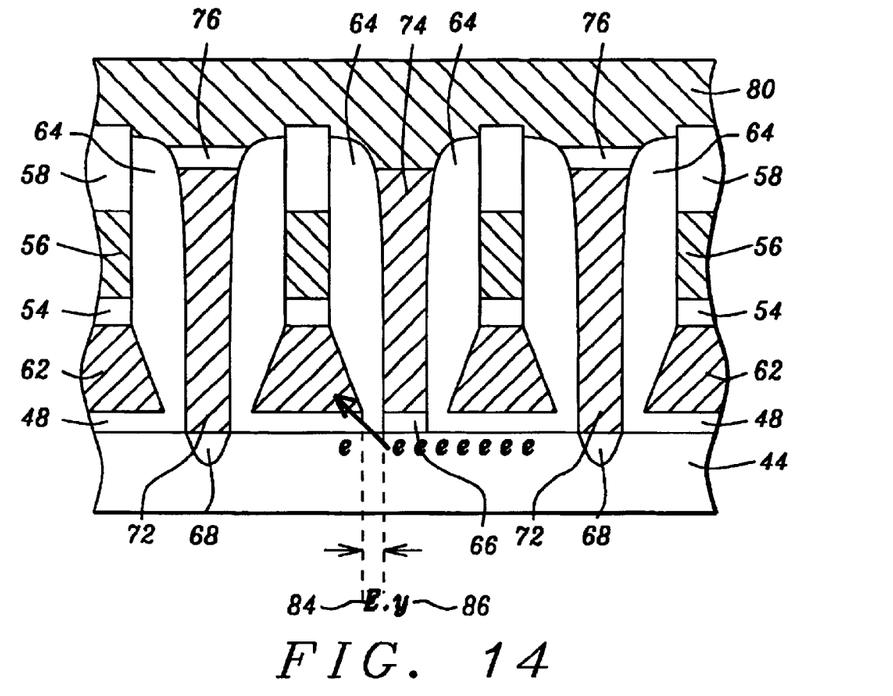
FIG. 14 shows source side programming in a split-gate flash memory cell with a trapezoidal floating gate according to the invention.

Referring to FIG. 14, there is depicted source side programming in a split-gate flash memory cell with a trapezoidal floating gate according to the invention. Channel electrons, 82, are accelerated by the lateral field E, 84, acting over the distance y, 86, which in contrast to traditional split-gate flash memory cells is considerably less the thickness of the insulator spacer between the control gate and select gate. The larger the field E the easier it is for electrons to attain sufficient energy so that they can readily overcome the barrier presented by the floating gate insulator layer and pass into the floating gate. Thus with larger fields, E, there is more efficient charge injection into the floating gate and greater programming speed. The magnitude of the field E is essentially proportional to the potential difference between the floating gate and select gate and inversely proportional to the separation between the floating gate and select gate closest to the semiconductor region, that is, to the distance x in the case of traditional split-gate flash memory cells and to the distance y in the case of split-gate flash memory cells according to the invention. Since y can be considerably less than x, than, for comparable potential differences, programming in split-gate flash memory cells with trapezoidal floating gates can be very much more efficient than traditional split-gale flash memory cells. Furthermore, the sidewall insulator spacer thickness above the floating gate, in cells according to the invention can be the same as for traditional cells. Therefore the faster programming speed is attained at no cost in satisfying low leakage, yield and reliability requirements.

Figure 15:
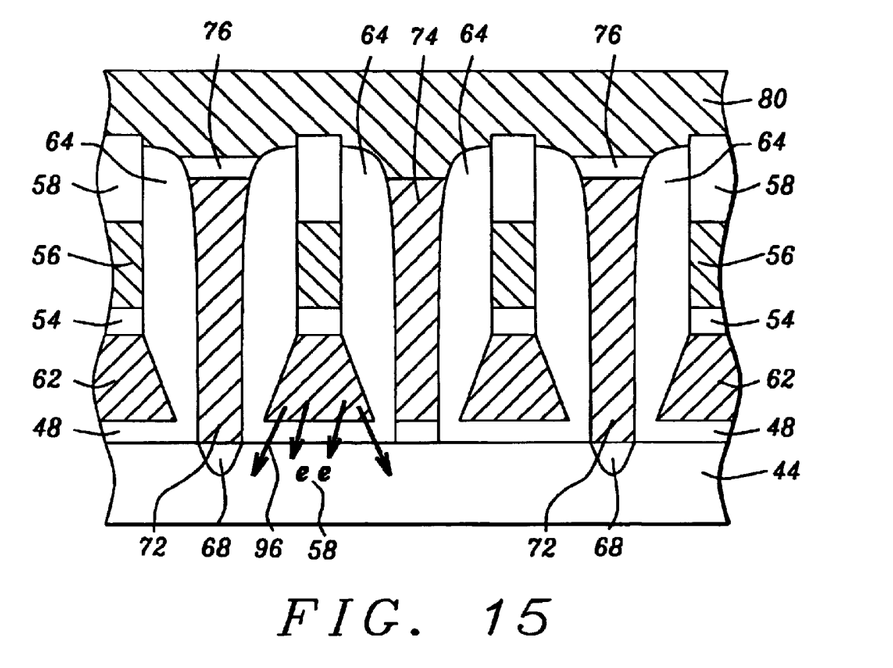
FIG. 15 shows channel erasing in a split-gate flash memory cell with a trapezoidal floating gate according to the invention.

Referring now to FIG. 2, there is depicted channel erasing in a split-gate flash memory cell with a trapezoidal floating gate according to the invention 1. In channel erasing an applied potential difference between the control gate, 56 and the semiconductor region, 44, sets up a field at the floating gate-floating gate insulator layer, 46, interface. Due to the action of this field electrons, 88, pass from the floating gate through the floating gate insulator layer and into the semiconductor region. The rate at which electrons are ejected from the floating gate, and therefore the erasing rate, is exponentially dependent on the interface field. In the vicinity of sharp corners of the floating gate at the interface there is an intensification of the interface field and a resulting even greater intensification of the erasing rate. In split-gate flash memory cells according to the invention there are sharp corners, 90, at the base of the trapezoidal floating gate and thus a significant intensification in channel erasing speed, whereas in traditional split-gate flash memory cells there are square corners, 40, which are not sharp enough for a significant intensification of the erasing rate.

While the invention has been particularly shown and described with reference to the preferred embodiments thereof, it will be understood by those skilled in the art that various changes in form and detail may be made without departing from the spirit and scope of the invention.

What is claimed is:

1. A structure for split-gate flash memory cells comprising:
   a semiconductor region within a substrate;
   parallel active regions within said semiconductor region separated by isolation regions;
   equally spaced trapezoidal floating gates, composed of a first conductive layer, having sharp corners facing said semiconductor region, which are disposed over said active regions and separated from the active regions by a first insulator layer;
   three tiered parallel strips perpendicular to said active regions and passing over said trapezoidal floating gates, comprising a bottom tier covering the trapezoidal floating gates composed of a second insulator layer, a middle tier composed of a second conductor layer and a top tier composed of a third insulator layer;
   insulator spacers, composed of a fourth insulator layer, disposed over the sidewalls of said three tiered parallel strips and over the sidewalls of said trapezoidal floating gates, with the parallel structures comprised of said floating gates, said three tiered parallel strips and said insulator spacers being designated floating gate towers;
   source/drain regions formed in said semiconductor region below source/drain openings, where source/drain opening is the designation of every other opening between said floating gate towers; source/drain contact lines composed of a third conductor layer, disposed over said source/drain regions, partially filling said source/drain openings and an insulator layer, composed of a fifth insulator layer, that is disposed over said source drain contact lines;
   select gates, composed of said third conductor layer and disposed over a sixth insulator layer that is disposed on said semiconductor region, which are columns rising over said active regions in those openings between said floating gate towers that are not source/drain openings and where the top of said select gates is below the top of said floating gate towers;
   parallel select gate contact lines composed of a fourth conductor layer and disposed over said active regions and contacting said select gates.

2. The structure of claim 1 wherein said semiconductor region is a silicon region.

3. The structure of claim 1 wherein said isolation regions are shallow trench isolation regions is a silicon region.

4. The structure of claim 1 wherein said first insulator layer is an oxide layer grown to a depth of about 100 Angstroms.

5. The structure of claim 1 wherein said floating gates have trapezoidal cross-sections with the sharp cornered base disposed over said first insulator layer.

6. The structure of claim 1 wherein said second insulator layer is an ONO layer with the top oxide, nitride and bottom oxide component layers each about 60 Angstroms.

7. The structure of claim 1 wherein said third insulator layer is a nitride layer about 1500 Angstroms thick.

8. The structure of claim 1 wherein said fourth insulator layer is a high temperature oxide layer about 600 Angstroms thick.

9. The structure of claim 1 wherein said fifth insulator layer is an oxide layer grown to a depth of about 300 Angstroms.

10. The structure of claim 1 wherein said sixth insulator layer is an oxide layer grown to a depth of about 150 Angstroms.

11. The structure of claim 1 wherein said first conductor layer is a polysilicon layer formed to a depth of about 800 Angstroms.

12. The structure of claim 1 wherein said second conductor layer is a polysilicon layer formed to a depth of about 1000 Angstroms.

13. The structure of claim 1 wherein said third conductor layer is a polysilicon layer formed to a depth of about 3000 Angstroms.

14. The structure of claim 1 wherein said fourth conductor layer is a polysilicon layer formed to a depth of about 1500 Angstroms.

15. A method of fabricating split-gate flash memory cells comprising:

providing a semiconductor region within a substrate;

forming isolation regions within said semiconductor region thus defining parallel active regions that are separated by said isolation regions;

forming a first insulator layer over said active regions;

forming a first conductor layer and patterning it into parallel strips disposed over said active regions;

forming three tiered parallel strips running perpendicular to said active regions and passing over said first conductor layer parallel strips, said three tiered parallel strips being comprised of a bottom tier composed of a second insulator layer, a middle tier composed of a second conductor layer and a top tier composed of a third insulator layer;

fashioning said first conductor layer into floating trapezoidal gates having sharp corners facing said semiconductor region;

forming insulator spacers, composed of a fourth insulator layer, disposed over the sidewalls of said three tiered parallel strips and over the sidewalls of said trapezoidal floating gates, the resulting structures comprised of said floating gates, said three tiered parallel strips and said insulator spacers being designated floating gate towers;

forming source/drain regions in said semiconductor region below source/drain openings, where said source/drain opening is the designation of every other opening between said floating gate towers;

forming source/drain contact lines composed of a third conductor layer and filling said source/drain openings except for a fifth insulator layer that is formed over said source/drain contact lines;

forming select gates, composed of said third conductor layer and disposed over a sixth insulator layer, the sixth insulator layer being formed on said semiconductor region in those openings between floating gate towers that are not source/drain openings, and the select gates being columns rising over active regions in openings between floating gate towers that are not source/drain openings so that the top of said select gates is below the top of said floating gate towers;

forming parallel select gate contact lines composed of a fourth conductor layer and disposed over said active regions and contacting said select gates.

16. The method of claim 15 wherein said semiconductor region is a silicon region.

17. The method of claim 15 wherein said isolation regions are shallow trench isolation regions region is a silicon region.

18. The method of claim 15 wherein said first insulator layer is an oxide layer grown to a depth of about 100 Angstroms.

19. The method of claim 15 wherein said floating gates have trapezoidal cross-sections with the sharp cornered base disposed over said first insulator layer.

20. The method of claim 15 wherein said second insulator layer is an ONO layer with the top oxide, nitride and bottom oxide component layers are each about 60 Angstroms, respectively.

21. The method of claim 15 wherein said third insulator layer is a nitride layer about 1500 Angstroms thick.

22. The method of claim 15 wherein said fourth insulator layer is a high temperature oxide layer about 600 Angstroms thick.

23. The method of claim 15 wherein said fifth insulator layer is an oxide layer grown to a depth of about 300 Angstroms.

24. The method of claim 15 wherein said sixth insulator layer is an oxide layer grown to a depth of about 150 Angstroms.

25. The method of claim 15 wherein said first conductor layer is a polysilicon layer formed to a depth of about 800 Angstroms.

26. The method of claim 15 wherein said second conductor layer is a polysilicon layer formed to a depth of about 1000 Angstroms.

27. The method of claim 15 wherein said third conductor layer is a polysilicon layer formed to a depth of about 3000 Angstroms.

28. The method of claim 15 wherein said fourth conductor layer is a polysilicon layer formed to a depth of about 1500 Angstroms.

* * * * *